(12) United States Patent
Obweger et al.

(10) Patent No.: US 11,195,730 B2
(45) Date of Patent: Dec. 7, 2021

(54) METHOD AND APPARATUS FOR PROCESSING WAFER-SHAPED ARTICLES

(71) Applicant: Lam Research AG, Villach (AT)

(72) Inventors: Rainer Obweger, Villach (AT);
Andreas Gleissner, Villach (AT);
Thomas Wirnsberger, Villach (AT);
Franz Kumnig, Villach (AT);
Alessandro Baldaro, Villach (AT);
Christian Thomas Fischer, Villach (AT); Mu Hung Chou, Villach (AT);
Rafal Ryszard Dylewicz, Villach (AT);
Nathan Lavdovsky, Villach (AT); Ivan L. Berry, III, Amesbury, CA (US)

(73) Assignee: Lam Research AG, Villach (AT)

(*) Notice: Subject to any disclaimer, the term of this patent is extended or adjusted under 35 U.S.C. 154(b) by 0 days.

(21) Appl. No.: 16/692,948

(22) Filed: Nov. 22, 2019

(65) Prior Publication Data
US 2020/0090956 A1 Mar. 19, 2020

Related U.S. Application Data

(63) Continuation of application No. 14/469,363, filed on Aug. 26, 2014, now Pat. No. 10,490,426.

(51) Int. Cl.
*H01L 21/67* (2006.01)
*H01L 21/687* (2006.01)
*H01L 21/311* (2006.01)

(52) U.S. Cl.
CPC .... *H01L 21/6708* (2013.01); *H01L 21/31133* (2013.01); *H01L 21/31138* (2013.01); *H01L 21/67115* (2013.01); *H01L 21/68792* (2013.01)

(58) Field of Classification Search
CPC .................. H01L 21/6708; H01L 21/67115
See application file for complete search history.

(56) References Cited

U.S. PATENT DOCUMENTS

| | | | |
|---|---|---|---|
| 4,871,417 A | 10/1989 | Nishizawa et al. | |
| 4,903,717 A | 2/1990 | Sumnitsch | |

(Continued)

FOREIGN PATENT DOCUMENTS

| | | | |
|---|---|---|---|
| CN | 1220193 A | 6/1999 | |
| CN | 1434490 A | 8/2003 | |

(Continued)

OTHER PUBLICATIONS

"Korean Application Serial No. 10-2015-0113445, Response filed Oct. 26, 2020 to Notice of Preliminary Rejection dated Aug. 25, 2020", w/ English Claims, 2 pgs.

(Continued)

*Primary Examiner* — Spencer E. Bell
(74) *Attorney, Agent, or Firm* — Schwegman Lundberg Woessner, P.A.

(57) ABSTRACT

A device for processing wafer-shaped articles comprises a closed process chamber that provides a gas-tight enclosure. A rotary chuck is located within the closed process chamber. A heater is positioned relative to the chuck so as to heat a wafer shaped article held on the chuck from one side only and without contacting the wafer shaped article. The heater emits radiation having a maximum intensity in a wavelength range from 390 nm to 550 nm. At least one first liquid dispenser is positioned relative to the chuck so as to dispense a process liquid onto a side of a wafer shaped article that is opposite the side of the wafer-shaped article facing the heater.

10 Claims, 3 Drawing Sheets

(56) References Cited

U.S. PATENT DOCUMENTS

| | | | |
|---|---|---|---|
| 5,513,668 | A | 5/1996 | Sumnitsch |
| 5,667,622 | A | 9/1997 | Hasegawa et al. |
| 5,818,137 | A | 10/1998 | Kaemmerer |
| 6,093,252 | A | 7/2000 | Wengert et al. |
| 6,358,676 | B1 | 3/2002 | Wu |
| 6,485,531 | B1 | 11/2002 | Schoeb |
| 6,517,998 | B1 | 2/2003 | Noda et al. |
| 6,536,454 | B2 | 3/2003 | Lindner |
| 6,779,534 | B2 | 8/2004 | Yamaguchi et al. |
| 6,867,150 | B2 | 3/2005 | Kikuchi et al. |
| 7,107,701 | B2 | 9/2006 | Takemura et al. |
| 7,173,216 | B2 | 2/2007 | Ptak |
| 7,965,372 | B2 | 6/2011 | Noda et al. |
| 8,147,618 | B2 | 4/2012 | Passegger |
| 8,277,564 | B2 | 10/2012 | Le et al. |
| 8,404,499 | B2 | 3/2013 | Moffatt |
| 8,793,898 | B2 | 8/2014 | Jeong et al. |
| 10,490,426 | B2 | 11/2019 | Obweger et al. |
| 2006/0112980 | A1 | 6/2006 | Kim et al. |
| 2007/0227556 | A1 | 10/2007 | Bergman |
| 2008/0226272 | A1 | 9/2008 | Kasai et al. |
| 2010/0314377 | A1 | 12/2010 | Kasai et al. |
| 2012/0160274 | A1 | 6/2012 | Kasai et al. |
| 2013/0143406 | A1 | 6/2013 | Hsu et al. |
| 2013/0160260 | A1 | 6/2013 | Frank et al. |
| 2014/0127908 | A1 | 5/2014 | Okutani |
| 2014/0270731 | A1 | 9/2014 | Gerling et al. |
| 2015/0079803 | A1 | 3/2015 | Huang et al. |
| 2016/0064242 | A1 | 3/2016 | Obweger et al. |

FOREIGN PATENT DOCUMENTS

| | | |
|---|---|---|
| CN | 1442881 A | 9/2003 |
| CN | 1841669 A | 10/2006 |
| CN | 101097837 A | 1/2008 |
| CN | 101359584 A | 2/2009 |
| CN | 101689491 A | 3/2010 |
| CN | 105390416 A | 3/2016 |
| CN | 105390416 B | 10/2018 |
| EP | 0504431 A1 | 9/1992 |
| JP | H05166718 A | 7/1993 |
| JP | H05326483 | 12/1993 |
| JP | H023921 A | 7/1997 |
| JP | 2005260088 | 9/2005 |
| JP | 2006518096 A | 8/2006 |
| JP | 2007141896 A | 6/2007 |
| JP | 2007149772 | 6/2007 |
| JP | 2007173432 | 7/2007 |
| JP | 2008004878 | 1/2008 |
| JP | 2012138510 A | 7/2012 |
| JP | 2012156268 A | 8/2012 |
| JP | 2013207042 A | 10/2013 |
| JP | 2014093449 | 5/2014 |
| JP | 2016046531 A | 4/2016 |
| JP | 6632833 B2 | 12/2019 |
| JP | 2020065062 | 4/2020 |
| KR | 20100014208 | 2/2010 |
| KR | 20120034948 | 4/2012 |
| KR | 20120059413 | 6/2012 |
| KR | 20130069124 | 6/2013 |
| KR | 20140063679 | 5/2014 |
| KR | 20140110970 | 9/2014 |
| KR | 20160024759 A | 3/2016 |
| TW | 201620039 A | 6/2016 |
| TW | I675419 B | 10/2019 |
| WO | WO-2007101764 A1 | 9/2007 |

OTHER PUBLICATIONS

"Japanese Application Serial No. 2019-223491, Response filed Jan. 8, 2021 to Notification of Reasons for Refusal dated Oct. 13, 2020", w/ English Claims, 11 pgs.

"Korean Application Serial No. 10-2015-0113445, Response filed Apr. 28, 2020 to Notice of Preliminary Rejection dated Feb. 28, 2020", w/ English Translation, 10 pgs.

"Korean Application Serial No. 10-2015-0113445, Notice of Preliminary Rejection dated Aug. 25, 2020", w/ English Translation, 14 pgs.

"Japanese Application Serial No. 2019-223491, Notification of Reasons for Refusal dated Oct. 13, 2020", w/ English Translation, 8 pgs.

"U.S. Appl. No. 14/469,363, Advisory Action dated Dec. 14, 2016", 3 pgs.

"U.S. Appl. No. 14/469,363, Appeal Brief filed Dec. 11, 2017", 40 pgs.

"U.S. Appl. No. 14/469,363, Appeal Decision dated Apr. 22, 2019", 8 pgs.

"U.S. Appl. No. 14/469,363, Corrected Notice of Allowability dated Oct. 21, 2019", 2 pgs.

"U.S. Appl. No. 14/469,363, Examiner Interview Summary dated Aug. 16, 2017", 3 pgs.

"U.S. Appl. No. 14/469,363, Examiner Interview Summary dated Oct. 23, 2017", 3 pgs.

"U.S. Appl. No. 14/469,363, Examiner Interview Summary dated Nov. 28, 2016", 3 pgs,.

"U.S. Appl. No. 14/469,363, Examiner's Answer to Appeal Brief dated Mar. 8, 2018", 7 pgs.

"U.S. Appl. No. 14/469,363, Final Office Action dated Sep. 13, 2017", 18 pgs.

"U.S. Appl. No. 14/469,363, Final Office Action dated Oct. 12, 2016", 12 pgs.

"U.S. Appl. No. 14/469,363, Non Final Office Action dated Apr. 18, 2016", 11 pgs.

"U.S. Appl. No. 14/469,363, Non Final Office Action dated May 24, 2017", 12 pgs.

"U.S. Appl. No. 14/469,363, Notice of Allowance dated Jul. 10, 2019", w/ English Translation, 8 pgs.

"U.S. Appl. No. 14/469,363, Response filed Feb. 3, 16 to Restriction Requirement dated Dec. 3, 2015", 2 pgs.

"U.S. Appl. No. 14/469,363, Response filed Aug. 14, 17 to Non Final Office Action dated May 24, 2017", 16 pgs.

"U.S. Appl. No. 14/469,363, Response filed Aug. 18, 16 to Non Final Office Action dated Apr. 18, 2016", 11 pgs.

"U.S. Appl. No. 14/469,363, Response filed Nov. 29, 16 to Final Office Action dated Oct. 12, 2016", 11 pgs.

"U.S. Appl. No. 14/469,363, Restriction Requirement dated Dec. 3, 2015", 6 pgs.

"Chinese Application Serial No. 201180049966.9, Office Action dated May 23, 2015", 4 pgs.

"Chinese Application Serial No. 201180049966.9, Office Action dated Aug. 29, 2016", 5 pgs.

"Japanese Application Serial No. 2015-161917, Amendment filed Sep. 26, 18", w/ English Claims, 9 pgs.

"Japanese Application Serial No. 2015-161917, Notice of Reasons for Refusal dated Jun. 25, 2019", 10 pgs.

"Japanese Application Serial No. 2015-161917, Response filed Sep. 24, 19 to Notice of Reasons for Refusal dated Jun. 25, 19", w/ English Claims, 15 pgs.

"Korean Application Serial No. 10-2015-0113445, Notice of Preliminary Rejection dated Feb. 28, 20", w/ English Translation, 13 pgs.

METHOD AND APPARATUS FOR PROCESSING WAFER-SHAPED ARTICLES

This application is a continuation of and claims the benefit of priority under 35 U.S.C. § 120 to U.S. patent application Ser. No. 14/469,368, filed on Aug. 26, 2014, which is incorporated by reference herein in its entirety.

BACKGROUND OF THE INVENTION

1. Field of the Invention

The invention relates generally to a method and apparatus for processing wafer-shaped articles, such as semiconductor wafers, in a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

Although many methods and apparatus for single wafer wet processing are known, it remains a difficult problem to strip photoresist from semiconductor wafers, especially when the photoresist is deeply implanted with ions such as boron and arsenic. Most such methods require the use of large volumes of concentrated sulfuric acid, which is a relatively expensive process chemical, and one that is moreover impractical to recycle.

SUMMARY OF THE INVENTION

The present inventors have developed improved methods and apparatus for treatment of wafer-shaped articles in closed process chambers, based on their unexpected discovery that heating the wafer-shaped article in a particular way, in combination with a controlled introduction of ozone gas into the chamber, results in a surprisingly effective removal of even deeply implanted photoresist from the wafer-shaped article.

Thus, in one aspect, the present invention relates to a device for processing wafer-shaped articles, comprising a closed process chamber comprising a housing providing a gas-tight enclosure. A rotary chuck is located within the closed process chamber, and is adapted to hold a wafer shaped article of a predetermined diameter thereon. A heater is positioned relative to the chuck so as to heat a wafer shaped article held on the chuck from one side only and without contacting the wafer shaped article. The heater emits radiation having a maximum intensity in a wavelength range from 390 nm to 550 nm. At least one first liquid dispenser is positioned relative to the chuck so as to dispense a process liquid onto a side of a wafer shaped article that is opposite the side of the wafer shaped article facing the heater. The selected wavelength enables primarily the substrate to be heated and not the chamber. Positioning the liquid dispenser on the opposite side of the wafer shaped article from the heater allows the front side of the wafer shaped article to be treated as the wafer shaped article is heated from the back side.

In preferred embodiments of the device according to the present invention, the chuck is a magnetic ring rotor positioned inside the chamber, and surrounded by a stator positioned outside the chamber.

In preferred embodiments of the device according to the present invention, the chuck is driven by a motor whose output is transmitted to a rotary shaft connected to the chuck.

In preferred embodiments of the device according to the present invention, the chamber comprises an upper region in which an outlet of the at least one first liquid dispenser is located and a lower region in which or adjacent to which the heater is located, whereby the heater is configured to heat a wafer shaped article from an underside thereof and the at least one first liquid dispenser is configured to dispense process liquid onto an upper side thereof.

In preferred embodiments of the device according to the present invention, the heater emits radiation having a maximum intensity in a wavelength range from 400 nm to 500 nm.

In preferred embodiments of the device according to the present invention, the heater comprises an array of blue light-emitting diodes.

In preferred embodiments of the device according to the present invention, the array of blue light-emitting diodes is substantially coextensive with a wafer shaped article of the predetermined diameter.

In preferred embodiments of the device according to the present invention, the device also includes an ozone generator configured to deliver ozone gas to a gas inlet that leads into the chamber.

In preferred embodiments of the device according to the present invention, the gas inlet is positioned relative to the chuck so as to deliver ozone gas toward a side of a wafer shaped article that is opposite the side of the wafer-shaped article facing the heater.

In preferred embodiments of the device according to the present invention, a first plate is positioned between the heater and a wafer shaped article when held on the chuck, the first plate being substantially transparent to radiation emitted by the heater.

In preferred embodiments of the device according to the present invention, the first plate is made of quartz or sapphire.

In preferred embodiments of the device according to the present invention, the first plate forms at least part of a wall of the chamber, the heater being mounted outside of the chamber.

In preferred embodiments of the device according to the present invention, the first plate is disposed above a base body of the chuck and below a wafer shaped article when held on the chuck, the first plate being mounted on the chuck inside the chamber.

In preferred embodiments of the device according to the present invention, a second plate is mounted on the chuck for rotation therewith, the second plate being on a same side of the wafer shaped article as the at least one first liquid dispenser, the second plate shielding an interior of one side of the chamber from liquid droplets flung off of the wafer shaped article.

In preferred embodiments of the device according to the present invention, at least one second liquid dispenser is mounted on a same side of the wafer shaped article as the heater.

In preferred embodiments of the device according to the present invention, the heater is configured to heat a silicon wafer of the predetermined diameter to a temperature in excess of 300° C.

In another aspect, the present invention relates to a method for processing wafer-shaped articles, comprising positioning a wafer-shaped article of a predetermined diameter on a rotary chuck located within a closed process chamber, heating the wafer shaped article from one side only and without contacting the wafer, with radiation having a maximum intensity in a wavelength range from 390 nm to 550 nm, and dispensing process liquid onto a side of the wafer shaped article that is opposite the side of the wafer-shaped article facing the heater.

The heating may be performed simultaneously with the dispensing of process liquid. Alternatively, or in addition, the dispensing of process liquid may be effected before and/or after heating of the wafer.

In preferred embodiments of the method according to the present invention, ozone that is primarily in gaseous form is introduced into the closed process chamber. Preferably the ozone is introduced into contact with the heated wafer shaped article after and/or during the time that the wafer shaped article is heated with radiation having a maximum intensity in a wavelength range from 390 nm to 550 nm.

In preferred embodiments of the method according to the present invention, the introducing of ozone and the dispensing of process liquid are performed sequentially without intervening removal of the wafer shaped article from the closed process chamber. This means that the liquid treatment can be conducted before and/or after the ozone treatment.

In a preferred embodiment ozone gas is supplied to the surface of the wafer shaped article not facing the heater. This preferably is conducted by at least one nozzle directed toward the side of the wafer-shaped article not facing the heater. Alternatively, the ozone gas can be supplied into the chamber through any other orifice e.g. near the edge of the wafer-shaped article of even through an opening in the heater.

In preferred embodiments of the method according to the present invention, the introducing of ozone and the dispensing of process liquid are performed simultaneously.

In preferred embodiments of the method according to the present invention, the wafer shaped article is a semiconductor wafer having semiconductor device components formed on a side of the wafer that is opposite the side facing the heater.

In preferred embodiments of the method according to the present invention, the process liquid is substantially free of sulphuric acid.

In preferred embodiments of the method according to the present invention, the heating of the wafer shaped article results in the wafer shaped article attaining a temperature in excess of 300° C.

In yet another aspect, the present invention relates to a process for stripping photoresist from a substrate, comprising dispensing an aqueous hydrogen peroxide solution onto a surface of the substrate, wherein the surface includes photoresist to be stripped, and wherein the substrate is disposed in a closed chamber; introducing an ozone atmosphere into the closed chamber while the aqueous hydrogen peroxide solution resides on the surface of the substrate; heating the substrate; and removing stripped photoresist from the substrate.

In preferred embodiments of the process according to the present invention, the heating is performed at a temperature in the range of 150° C. to 500° C.

In preferred embodiments of the process according to the present invention, the heating is performed at a temperature in the range of 200° C. to 450° C.

In preferred embodiments of the process according to the present invention, the heating is performed at a temperature in the range of 250° C. to 400° C., and preferably in excess of 300° C.

In preferred embodiments of the process according to the present invention, the aqueous hydrogen peroxide solution has a peroxide concentration of 20-40%, preferably 25-35%, and more preferably 30-34%.

In preferred embodiments of the process according to the present invention, the substrate is a semiconductor wafer.

In preferred embodiments of the process according to the present invention, the semiconductor wafer is mounted on a spin chuck during the process.

In preferred embodiments of the process according to the present invention, introduction of the ozone atmosphere into the closed chamber commences prior to dispensing of the aqueous hydrogen peroxide solution onto the surface of the substrate.

In preferred embodiments of the process according to the present invention, the dispensing is puddle dispensing, in which a predetermined volume of the aqueous hydrogen peroxide solution is maintained on the surface of the substrate.

In preferred embodiments of the process according to the present invention, the dispensing is flow dispensing, in which the aqueous hydrogen peroxide solution is flowed across and off of the surface of the substrate.

In preferred embodiments of the process according to the present invention, the closed chamber is free of mineral acids during the process.

In preferred embodiments of the process according to the present invention, the closed chamber is free of sulfuric acid during the process.

In preferred embodiments of the process according to the present invention, the aqueous hydrogen peroxide solution is dispensed onto the substrate at a flow rate of 200-800 ml/min, preferably 300-700 ml/min, more preferably 400-600 ml/min, and most preferably 450-550 ml/min.

In preferred embodiments of the process according to the present invention, the aqueous hydrogen peroxide solution is maintained in contact with the substrate for 30-180 seconds, preferably 45-150 seconds, more preferably 60-120 seconds and most preferably 80-110 seconds.

In preferred embodiments of the process according to the present invention, the removing of stripped photoresist from the substrate comprises rinsing the substrate with deionized water.

In preferred embodiments of the process according to the present invention, the surface is contacted with nitrogen gas after the removing, so as to dry the surface.

In preferred embodiments of the process according to the present invention, the photoresist to be stripped from the surface of the substrate is a carbon hardmask film.

In preferred embodiments of the process according to the present invention, the heating commences after introduction of ozone into the closed chamber has commenced, and wherein the heating terminates while the aqueous hydrogen peroxide solution is still in contact with the surface of the substrate.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
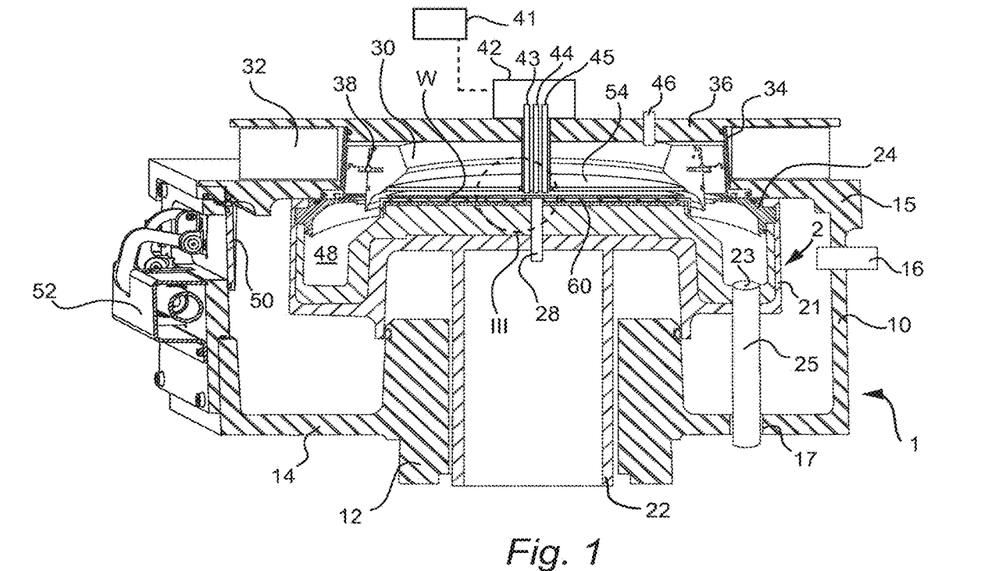
FIG. 1 is an explanatory cross-sectional side view of a process chamber according to a first embodiment of the invention, in its operating position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members (not shown) for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 34 serve as a motor by which the ring rotor 30 (and thereby a supported wafer W) may be rotated through an active magnetic bearing. For example, the stator 34 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 has a manifold 42 mounted on its exterior, which supplies a medium inlets 43, 44, 45 that traverse the lid 36 and open into the chamber above the wafer W. Preferably at least three nozzles provided. One of the nozzles 43, 44, 45 is supplied with ozone that is primarily in gaseous form, from the ozone generator 41 indicated schematically in FIG. 1. The other two nozzles may for example supply an acid and a rinsing liquid (such as deionized water or isopropyl alcohol), respectively.

It will be noted that the wafer W in this embodiment hangs downwardly from the rotary chuck 30, supported by the gripping members of the chuck 30, such that fluids supplied through inlets 43, 44, 45 would impinge upon the upwardly facing surface of the wafer W.

Another fluid inlet is shown schematically at 46, which in preferred embodiments communicates with a supply of nitrogen gas. If desired, a series of such inlets may be provided at respectively different radial positions along the lid 36.

In case wafer W is a semiconductor wafer, for example of 300 mm or 450 mm diameter, the upwardly facing side of wafer W could be either the device side or the opposite side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or closed, position, in which the rotary chuck 30 is shielded from the outer cylindrical wall 10 of chamber 1. Cover 2 in this embodiment is generally cup-shaped, comprising a base surrounded by an upstanding cylindrical wall 21. Cover 2 furthermore comprises a hollow shaft 22 supporting the base and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

Figure 2:
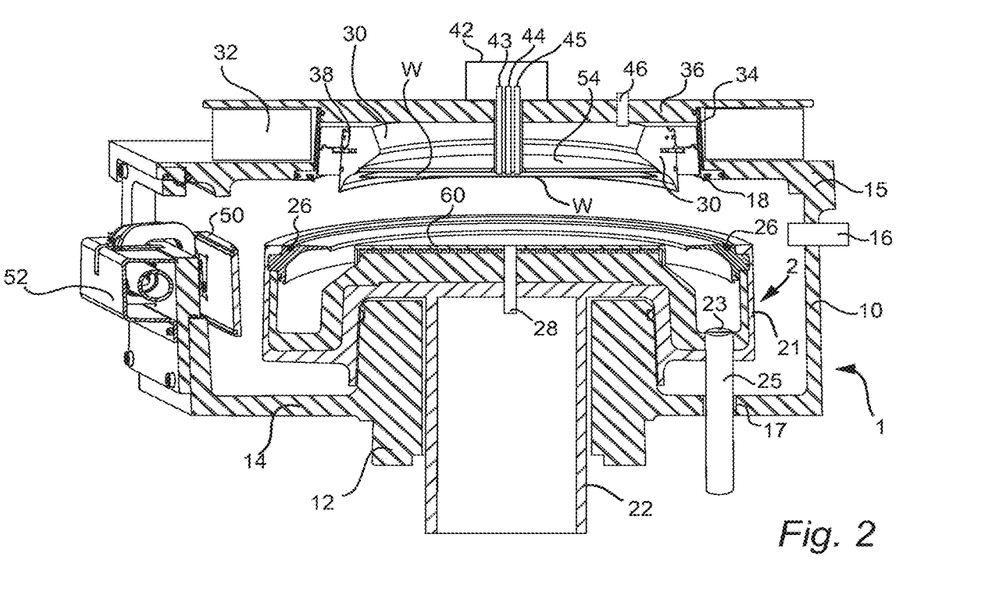
FIG. 2 is an explanatory cross-sectional side view of a process chamber according to the first embodiment of the invention, in its loading and unloading position.

At the top of cylindrical wall 21 there is attached an annular deflector member 24, which carries on its upwardly-facing surface a gasket 26 (see FIG. 2). Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, and is connected to a suitable exhaust conduit (not shown).

The position depicted in FIG. 2 corresponds to loading or unloading of a wafer W. In particular, a wafer W can be loaded onto the rotary chuck 30 through the side door 50, which is shown in its open position in FIG. 2, so as to permit loading or unloading of a wafer W.

In FIG. 1, the interior cover 2 has been moved to its closed position, which corresponds to processing of a wafer W. That is, after a wafer W is loaded onto rotary chuck 30, the door 50 is moved to its closed, or first, position as shown in FIG. 1, and the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its closed position as depicted in FIG. 1, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1.

During processing of a wafer, processing fluids may be directed through medium inlets 43-46 and/or 28 to a rotating wafer W in order to perform various processes, such as etching, cleaning, rinsing, and any other desired surface treatment of the wafer undergoing processing.

Figure 3:
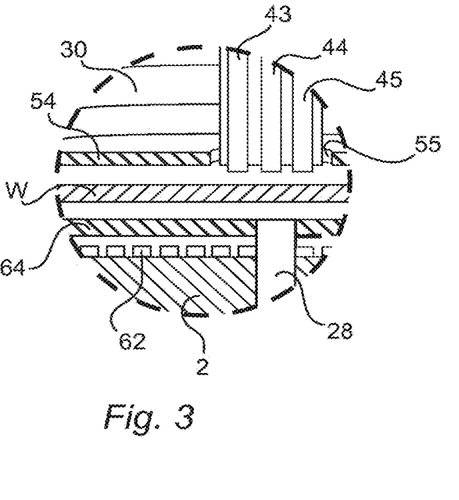
FIG. 3 is an enlarged view of the detail III in FIG. 1.

The interior cover 2 in this embodiment is also provided with a heating assembly 60, which is shown on an enlarged scale in FIG. 3. As shown in FIG. 3, the heating assembly 60 of this embodiment comprises a multiplicity of blue LED lamps 62 carried by the interior cover 2. The cross-sectional view shows a line of such lamps, however, they are preferably arranged so as to fill as fully as possible a circular area on the interior cover 2 that is coextensive with the wafer W. The area occupied by the lamps 62 may if desired be somewhat larger than the area of the wafer W that the chuck 30 is designed to hold.

This arrangement has the advantage that the wafer W can be heated by the heating assembly 60 over its full extent, from the center to the outermost periphery of the wafer.

The array of blue LED lamps 62 in this embodiment is covered by a plate 64. Plate 64 is preferably formed of quartz or sapphire, both of which materials are substantially transparent to the wavelengths emitted by the blue LED lamps 62. Other materials with similar transmission properties could thus be used for the plate 64. Plate 64 serves to protect the LED lamps 62 from chemicals used in the process chamber. A central opening is formed in the interior cover 2 and the plate 64, to accommodate the fluid medium inlet 28.

A second plate 54 is positioned above the wafer W in this embodiment. Whereas plate 64 is stationary with the interior cover 2, plate 54 is mounted on the rotary chuck and therefore rotates therewith. If desired, plate 54 could also be mounted in a stationary manner relative to chuck 30, but it is preferred to have the plate 54 rotate with chuck 30.

Plate 54 preferably overlies the entire upper surface of wafer W, except that plate 54 preferably has a central opening 55 through which pass the discharge ends of the fluid inlets 43, 44, 45.

Provision of the plate 54 integrated with chuck 30, between wafer W and the top 36 of chamber 1, gives rise to a number of advantages. The plate 54 in use is rotating with the chuck and at the same speed thereof, and hence also is rotating with a wafer W gripped by the chuck 30, and also at the same speed as wafer 30. This design therefore serves to minimize turbulence in the employed process fluids.

Furthermore, it is possible to minimize temperature differences during a drying process by cooling the plate 54 with deionized water. Still further, residual process media above the wafer W on the underside of plate 54, caused for example by splashing and/or condensation, can be rinsed simultaneously during the aforementioned deionized water rinse, or can be rinsed with deionized water after completion of the process.

As the plate 54 segregates the chamber interior from the upwardly facing side of the wafer W, this serves to minimize contamination by backsplashing and or particles. Plate 54 furthermore permits enhanced atmosphere control above the wafer. Still further, this design also allows gap processes, i.e., processes in which the gap between wafer and the chuck is filled with liquid.

The blue LED lamps 62 have a maximums intensity at a wavelength of about 450 nm. Other sources of radiation could be used, but it is preferred to use sources emitting radiation having a maximum intensity in a wavelength range from 390 nm to 550 nm and more preferably in a wavelength range from 400 nm to 500 nm.

Whereas radiation of that wavelength characteristic is largely transmitted by the plate 64, that same radiation is largely absorbed by the semiconductor material of the wafer W, especially when the wafer W is silicon. It has been found to be especially advantageous to heat the wafer W from one side in this manner, while exposing the opposite side of wafer W to ozone gas within the process chamber.

More particularly, a silicon wafer W having device structures formed thereon, and from which a layer of deeply implanted photoresist is formed, is positioned on chuck with the device side facing up. Because the wafer W is heated from below by the blue LED lamps 62, and because the radiation from those lamps is largely absorbed by the wafer, photo-corrosion of the device side of the wafer W is prevented.

In the other hand, this manner of heating the wafer W provides sufficient energy to activate the ozone that has been supplied to the device side of the wafer. This technique is in contrast to IR heating, which heats the wafer and surrounding device structure indiscriminately.

Because the present device and methods selectively heat the wafer, cooling performance is also enhanced. For example, as the plate 64 largely transmits the radiation emitted from lamps 62, the plate 64 does not heat up nearly so much as with IR heating, and therefore can help to more rapidly dissipate the heat from the wafer W after a heating stage is completed.

Although in the present embodiment the LED lamps 62 are beneath the wafer and the ozone inlet is above, it will be appreciated that their positions could be reversed.

Figure 4:
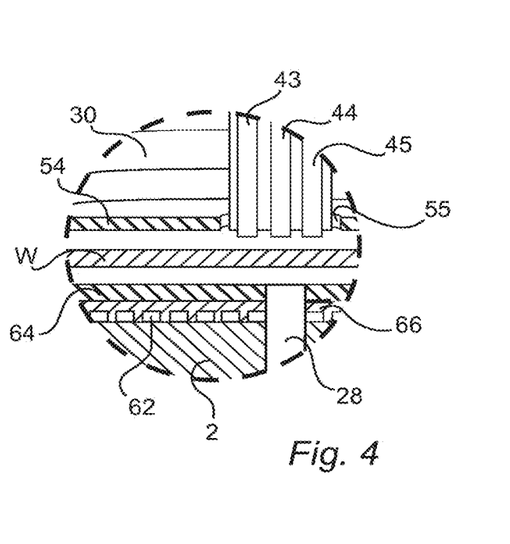
FIG. 4 is a view similar to that of FIG. 3, showing an alternative embodiment.

In FIG. 4, a variation of the heating assembly 60 is shown, in which the plate 64 forms with the interior cover 2 a sealed chamber through which a cooling fluid 66 (e.g. gas or liquid) is circulated, so as to prevent overheating of the LED lamps 62.

Figure 5:
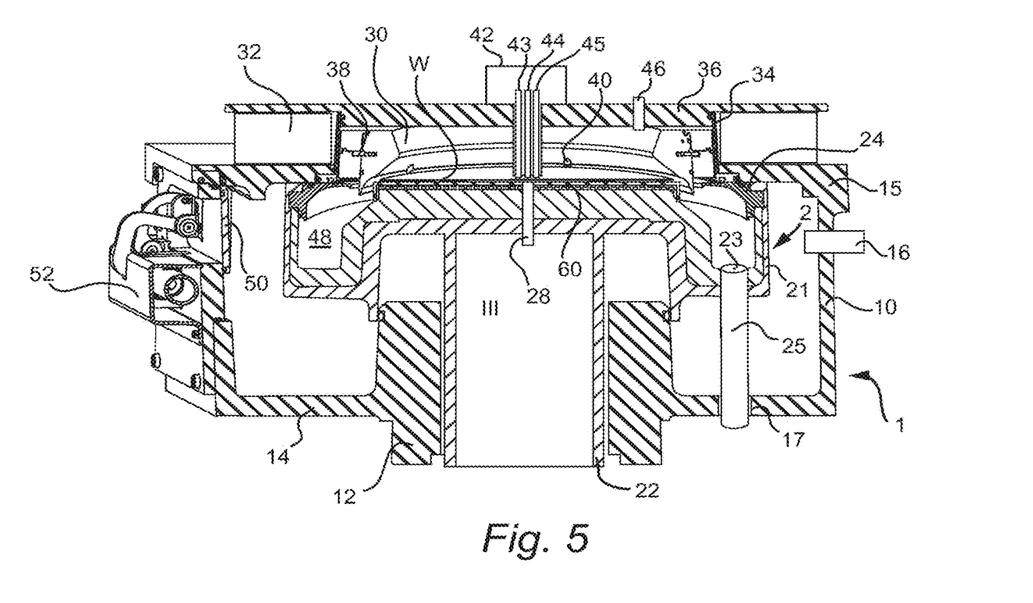
FIG. 5 is an explanatory cross-sectional side view of a process chamber according to another embodiment of the invention.

FIG. 5 shows another embodiment of a device for treatment of wafer-shaped articles W according to a preferred embodiment of the invention. The device of FIG. 5 differs from that of FIGS. 1 and 2 in that the plate 54 of the preceding embodiment is not present in the embodiment of FIG. 5. Without the plate 54 present, the gripping pins 40 are visible, which project downwardly from the chuck 30 and engage the peripheral edge of the wafer.

Figure 6:
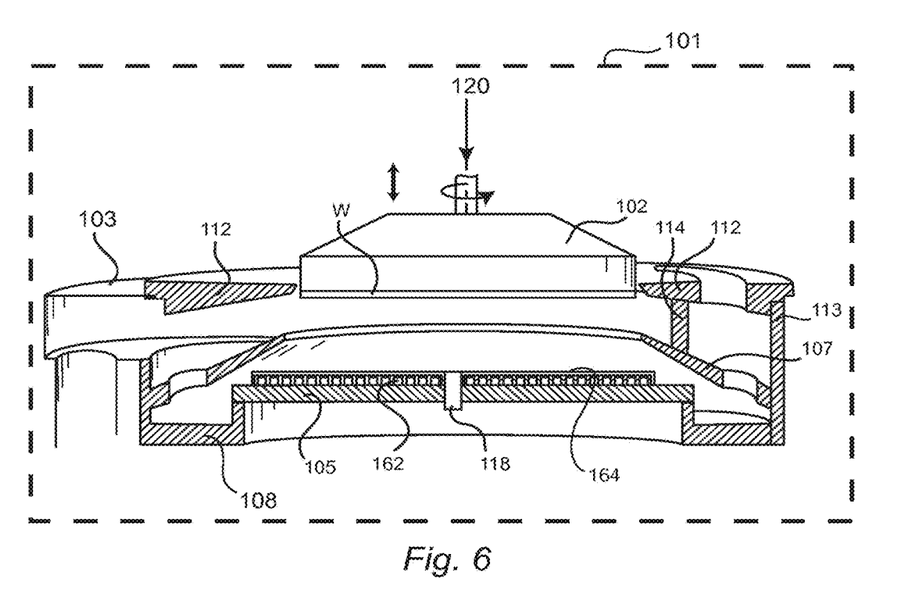
FIG. 6 is an explanatory cross-sectional side view of a process chamber according to a still further embodiment of the invention.

FIG. 6 shows yet another embodiment of a device for treatment of wafer-shaped articles W according to a preferred embodiment of the invention. The device comprises a spin chuck 102 and a surrounding collector 103 positioned in a closed process chamber 101. The collector 103 comprises a bottom plate 105, an annular duct 108, an outer side-wall 113, an annular top cover 112, a baffle 114 and a splash guard 107. The collector 103 is connected to the spin chuck 102 via a lifting mechanism (not shown) concentric to the axis of rotation of the spin chuck 102.

The edge of the bottom plate 105 is tightly connected with the inner upwardly projecting cylindrical sidewall of the annular duct 108. The outer diameter of the plate 105 is at least as big as the diameter of the wafer W. The peripheral edge of the annular duct 108 is tightly connected with the bottom edge of the cylindrical outer side-wall 113. The top edge of the cylindrical side-wall 113 is tightly connected with the peripheral edge of an annular top cover 112. The diameter of inner edge of the top cover is about 2 mm greater than the diameter of the spin chuck 102 so that the spin chuck 102 can easily pass through the opening of the top cover 112.

Within the collector 103 an annular splash guard 107 is horizontally arranged. The splash guard 107 is tapered towards its periphery and its inner edge is about 2 mm greater than the diameter of the spin chuck 102 so that the spin chuck 102 can easily pass through the opening. The peripheral edge of the splash guard 107 is tightly connected with the outer side-wall 113. The splash-guard 107 is arranged between the top cover 112 and the duct 108.

On the gas-entry side of the collector 103 a baffle 114 is tightly connected with the cover 112 on the baffle's upper edge and with the splash-guard 107 on the baffle's lower side. The baffle has the shape of a section of a cylinder.

A device of this type is more fully described in commonly-owned U.S. Pat. No. 8,147,618.

Different media (liquid and/or gas) can be supplied to the wafer-shaped article W through a first media supply 118 located near the centre of the plate and directed towards the disc-like article. A second media supply 120 is provided in the spin chuck near the centre of the spin chuck and directed towards. Therefore a disc-like article (e.g. a semiconductor wafer) can be treated from both sides either simultaneously or alternatively.

The bottom plate 105 in this embodiment is provided with an array of blue LED lamps 162 as described in connection with the foregoing embodiments, which lamps 162 are covered with a plate 164 of sapphire or quartz, as also described previously. Thus, when chuck 102 is lowered so as to place wafer W in close proximity to the lamps 162, heating of the wafer N can be effected as described in connection with the foregoing embodiments. Before, during or after such heating, gas such as ozone gas can be introduced to the upper side of wafer W through inlet 120, as the wafer W is rotated by a motor driven shaft in the direction of the rotary arrow shown in FIG. 6.

Figure 7:
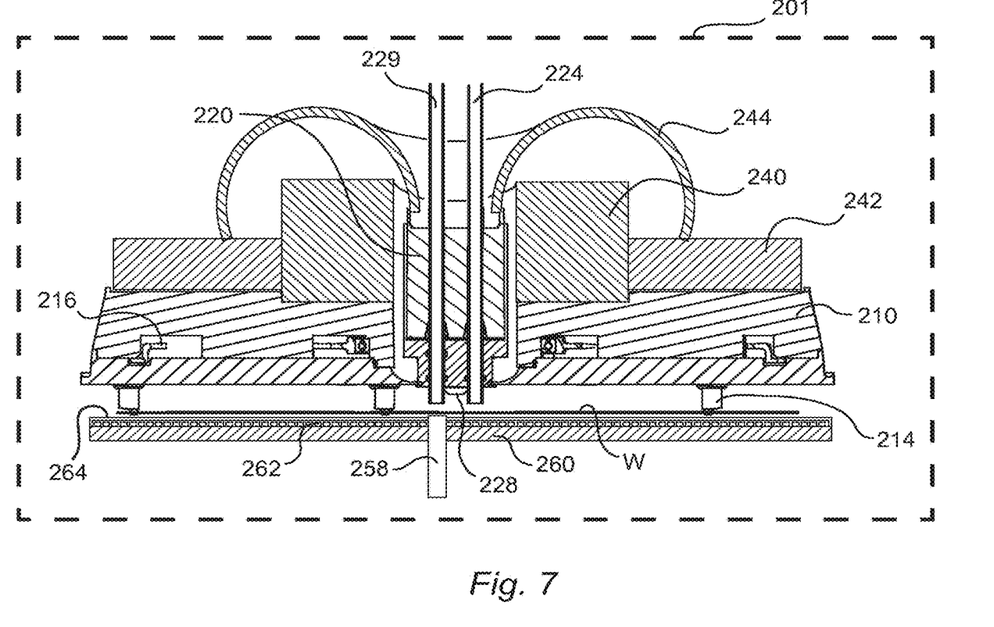
FIG. 7 is an explanatory cross-sectional side view of a process chamber according to a yet still further embodiment of the invention.

FIG. 7 shows still another embodiment of a device for treatment of wafer-shaped articles W according to a preferred embodiment of the invention. The device comprises a spin chuck. 210, which is mounted to the rotor of a hollow-shaft motor 240, and a stationary nozzle head 220 which penetrates through a central hole of the spin chuck 210. The stator of the hollow-shaft motor 240 is mounted to the mounting plate 242. Nozzle head 220 and mounting plate 242 are mounted to the same stationary frame 244, within a closed process chamber 201.

The spin chuck 210 comprises six cylindrically shaped holding elements 214 with eccentrically mounted gripping pins, only three of which are visible in FIG. 7. The gripping pins are rotated about the axis of their respective holding element by a ring gear 216, so as to secure and release a wafer W.

The non-rotating nozzle head 220 penetrates through the center hole of the spin chuck leaving a gap between the spin chuck and the nozzle head of 0.2 mm. The gap can be purged by gas (e.g. nitrogen) during processing. In this embodiment, three pipes 224, 228, 229 lead through the nozzle head. Pipes 224, 228, 229 are each connected to different gas or liquid sources, as described in connection with the inlets 43, 44, 45 of the first embodiment, and project 5 mm below the bottom surface of the spin chuck as well as the nozzle head.

The openings (nozzles) of pipes 224, 228, 229 are directed towards the upwardly facing surface of the wafer. Another nozzle assembly 258 is provided below the spin chuck in order to supply liquid and/or gas to the downwardly-facing surface of the wafer W.

Nozzle 258 passes through a central opening formed in a heater assembly 260. Heater assembly 260 comprises an array of blue LED lamps 262, which are covered by a plate 264 made of sapphire or quartz, as in the preceding embodiments. No plate is provided above the wafer W in this embodiment; however, it will be appreciate that such a plate could be provided, in which case it would preferably be mounted centrally to the nozzle head 220 and extend radially outwardly therefrom in a cantilever fashion to a diameter that is just inside the inside edges of the holding elements 214.

The present inventors have surprisingly discovered that a dry process utilizing ozone that is primarily in gaseous form, together with heating as described above, more effectively removes deeply implanted photoresist than conventional wet methods.

Furthermore, the dry process with ozone gas can be alternated with a wet process in which the wafer is treated for example with SC1 (aqueous solution of ammonium hydroxide and hydrogen peroxide) before and/or after the dry process, without removing the wafer W from the process chamber between the wet and dry processes. Such a sequential technique even more fully removes deeply implanted photoresist, yet does not require the use of sulphuric acid as in conventional wet stripping techniques.

The following table sets forth exemplary processing conditions for use in preferred embodiments of the methods and apparatus according to the present invention.

| Parameter | 1<br>O3 pre<br>purge | 2<br>Temp ramp<br>up | 3<br>HT process | 4<br>cool down | 5<br>DIW<br>(cool down) | 6<br>DIW<br>(+chuck clean) | 7<br>Wet 2<br>(i.e. SC1) | 8<br>DIW | 9<br>NZ dry |
|---|---|---|---|---|---|---|---|---|---|
| Baseline recipe Dry O3 + Wet 2 | | | | | | | | | |
| Current step time (sec) | 40 | 24 | 60 | 60 | 10 | 60 | 60 | 60 | 70 |
| [Range] | [10-40] | — | [30-120] | [10-60] | [10-30] | [10-60] | [10-90] | [20-60] | [20-70] |
| chuck speed (rpm) | 10/400 | 10/400 | 10/400 | 400 | 800 | 400 | 400 | 400 | 900 |
| O3 gas | 280 | 280 | 280 | — | — | — | — | — | — |
| Chuck clean | — | — | — | — | Y/N | Y | — | Y/N | — |

-continued

| | Baseline recipe Dry O3 + Wet 2 | | | | | | | | |
|---|---|---|---|---|---|---|---|---|---|
| Parameter | 1<br>O3 pre<br>purge | 2<br>Temp ramp<br>up | 3<br>HT process | 4<br>cool down | 5<br>DIW<br>(cool down) | 6<br>DIW<br>(+chuck clean) | 7<br>Wet 2<br>(i.e. SC1) | 8<br>DIW | 9<br>NZ dry |
| medium top center flow | — | — | — | — | N | Y | Y | Y | — |
| medium bottom center fow | — | — | — | — | Y | Y | Y | Y | — |
| Heating | | | Y | | | | | | |

In the table, O3 denotes ozone that is primarily in gaseous form. It will be understood that in practice ozone is delivered together with a carrier gas, preferably oxygen, because ozone generators transform ozone to oxygen only partially. HT in the table stands for high temperature and DIW means deionized water.

Another process that can be performed using the devices of the foregoing embodiments is a perozone technique for stripping photoresist, and preferably encrusted or deeply implanted photoresist, in which hydrogen peroxide is dispensed onto a wafer surface in the closed process chamber, either by puddle dispensing or by flow dispensing. Ozone that is primarily in gaseous form is introduced into the closed process chamber while an aqueous solution of hydrogen peroxide is present on the wafer surface.

The ozone and hydrogen peroxide are supplied to the same side of the wafer, e.g., an upwardly facing side carrying semiconductor device structures that are at least partly manufactured. The wafer is heated from the opposite side using the heater assembly as described above. Heating can occur before, during and/or after introduction of the aqueous hydrogen peroxide, and ozone gas into the process chamber.

The heating is performed until the wafer reaches a temperature in the range of 150° C. to 500° C., preferably 200° C. to 450° C., more preferably 250° C. to 400° C., and most preferably in excess of 300° C. The aqueous hydrogen peroxide solution has a peroxide concentration of 20-40%, preferably 25-35%, and more preferably 30-34%.

Introduction of the ozone atmosphere into the closed chamber may commence prior to or subsequent to dispensing of the aqueous hydrogen peroxide solution onto the surface of the substrate. Heating of the wafer may commence before or after introduction of ozone into the closed chamber has commenced. Heating of the wafer preferably is terminated terminates while the aqueous hydrogen peroxide solution is still in contact with the surface of the substrate. Preferably, the process does not use mineral acids, especially sulphuric acid.

The aqueous hydrogen peroxide solution may be dispensed onto the wafer at a flow rate of 200-800 ml/min, preferably 300-700 ml/min, more preferably 400-600 ml/min, and most preferably 450-550 ml/min. The aqueous hydrogen peroxide, solution is maintained in contact with the substrate for 30-180 seconds, preferably 45-150 seconds, more preferably 60-120 seconds and most preferably 80-110 seconds.

The process may also include rinsing the wafer with deionized water, and drying with nitrogen gas.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. Device for processing wafer-shaped articles, comprising
   a process chamber defining an enclosure,
   a rotary chuck located within said process chamber, said rotary chuck being adapted to hold a water-shaped article of a predetermined diameter thereon,
   a stationary heater positioned to face an underside of a wafer-shaped article placed on said rotary chuck so as to heat a wafer-shaped article held on said rotary chuck from the underside of the wafer-shaped article and without contacting the wafer-shaped article,
   said stationary heater emitting radiation having a maximum intensity in a wavelength range from 390 nm to 550 nm, and
   at least one first liquid dispenser positioned relative to said rotary chuck so as to dispense a process liquid onto a side of the wafer-shaped article that is opposite the side of the wafer-shaped article facing the stationary heater.

2. The device according to claim 1, wherein said rotary chuck is driven by a motor whose output is transmitted to a rotary shaft connected to said rotary chuck.

3. The device according to claim 1, wherein said stationary heater emits radiation having a maximum intensity in a wavelength range from 400 nm to 500 nm.

4. The device according to claim 1, wherein said stationary heater comprises an array of blue light-emitting diodes.

5. The device according to claim 1, wherein the stationary heater includes an array of heating elements, which is substantially coextensive with the wafer-shaped article of said predetermined diameter.

6. The device according to claim 1, further comprising a first plate between said stationary heater and the wafer-shaped article when held on said rotary chuck, said first plate being substantially transparent to radiation emitted by said stationary heater.

7. The device according to claim 6, wherein said first plate is made of quartz or sapphire.

8. The device according to claim 6, further comprising a second plate, the second plate located above the wafer-shaped article and rotating with the rotary chuck.

9. The device according to claim 1, further comprising at least one second liquid dispenser mounted on a same side of the wafer-shaped article as said stationary heater.

10. The device according to claim 1, wherein said stationary heater is configured to heat the wafer-shaped article of said predetermined diameter to a temperature in excess of 300° C.

* * * * *